United States Patent
Masuda et al.

(10) Patent No.: US 8,072,138 B2
(45) Date of Patent: Dec. 6, 2011

(54) ORGANIC SEMICONDUCTOR ELEMENT WITH SHIELD LAYER

(75) Inventors: Tsuyoshi Masuda, Onoda (JP); Tadaoki Mitani, Nomi (JP); John Rennie, Komae (JP); Kounosuke Uozumi, Kanazawa (JP)

(73) Assignees: Japan Science and Technology Agency, Saitama (JP); Tsuyoshi Masuda, Yamaguchi (JP); Tadaoki Mitain, Ishikawa (JP); Komatsu Seiren Co., Ltd., Ishikawa (JP)

( * ) Notice: Subject to any disclaimer, the term of this patent is extended or adjusted under 35 U.S.C. 154(b) by 272 days.

(21) Appl. No.: 11/628,863

(22) PCT Filed: Jun. 10, 2005

(86) PCT No.: PCT/JP2005/010656
§ 371 (c)(1),
(2), (4) Date: Jan. 17, 2007

(87) PCT Pub. No.: WO2005/122644
PCT Pub. Date: Dec. 22, 2005

(65) Prior Publication Data
US 2008/0050585 A1    Feb. 28, 2008

(30) Foreign Application Priority Data
Jun. 11, 2004   (JP) .................... 2004-174854

(51) Int. Cl.
*H01L 51/00* (2006.01)
*H05B 33/04* (2006.01)

(52) U.S. Cl. ........................ 313/512; 313/506
(58) Field of Classification Search .............. 313/512, 313/506
See application file for complete search history.

(56) References Cited

U.S. PATENT DOCUMENTS

| | | | |
|---|---|---|---|
| 2003/0017297 A1* | 1/2003 | Song et al. | 428/68 |
| 2004/0054053 A1* | 3/2004 | Mori | 524/409 |
| 2004/0212759 A1* | 10/2004 | Hayashi | 349/84 |
| 2005/0084214 A1* | 4/2005 | Hayashi et al. | 385/40 |
| 2006/0061272 A1* | 3/2006 | McCormick et al. | 313/512 |

FOREIGN PATENT DOCUMENTS

| JP | 2000-068050 A | 3/2000 |
|---|---|---|
| JP | 2004-039468 A | 2/2004 |

OTHER PUBLICATIONS

JP200068050 Komaki et al., Transaltion.*

* cited by examiner

*Primary Examiner* — Karabi Guharay
(74) *Attorney, Agent, or Firm* — Manabu Kanesaka

(57) ABSTRACT

An organic semiconductor element part formed on a substrate is covered with a planarizing layer, a radiator plate is fixed with an adhesive layer on the planarizing layer, and a shield layer intercepting the adverse effects exerted on the organic semiconductor element part during the curing of the adhesive layer is formed between the adhesive layer and the planarizing layer. When the adhesive layer is a photo-curing adhesive layer, the shield layer prefers to intercept the light used for curing the photo-curing adhesive layer. When the adhesive layer is a thermosetting adhesive layer, the shield layer prefers to intercept the outgassing occurring during the curing of the thermosetting adhesive layer. By adopting this configuration, it is made possible to accomplish infallible interception of oxygen and moisture and effect radiation of heat with high efficiency. It is further made possible to suppress the adverse effect induced during the adhesion of the radiator plate and prevent the organic semiconductor element part (organic EL element) from being deteriorated.

2 Claims, 6 Drawing Sheets

Fig. 9 (a)
Fig. 9 (b)
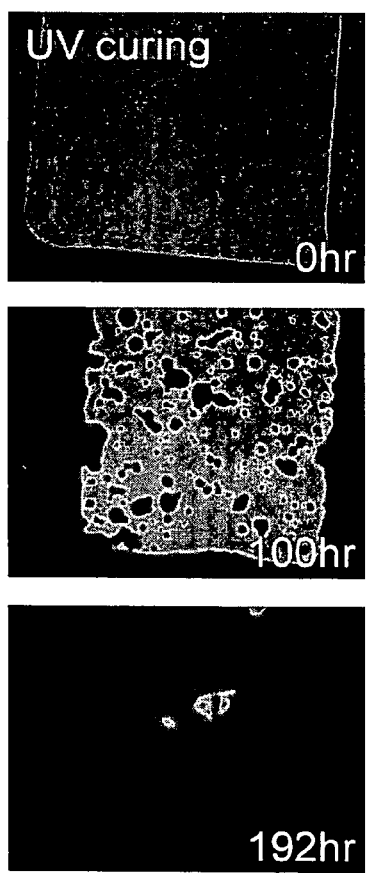
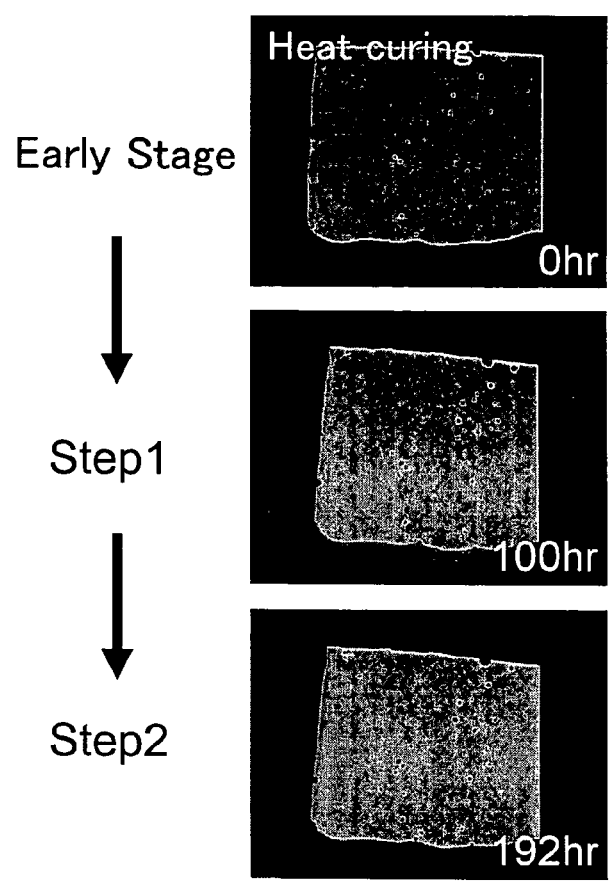
Early Stage
Step1
Step2

110°C

120°C

ORGANIC SEMICONDUCTOR ELEMENT WITH SHIELD LAYER

TECHNICAL FIELD

This invention relates to an organic semiconductor element furnished with a film-sealed structure, particularly to an electroluminescence element, and to an organic semiconductor element furnished with a novel structure that is capable of reconciling film sealing and thermal radiation.

BACKGROUND ART

The organic electroluminescence (hereinafter referred as "EL") element that is one kind of organic semiconductor element is expected to find application to a wide range of fields such as illumination and display because it is the spontaneous light-emitting type of sheet light source manifesting thinness and lightness in build and wideness in angular field of view. The ordinary organic EL element is furnished with an element part resulting from stacking a transparent electrode as an anode, an organic layer containing at least a light-emitting layer, and a cathode sequentially in the order mentioned on a transparent substrate, for example, and is so configured as to extract from the back surface side of the substrate the light generated by feeding electric current to the organic layer.

Incidentally, since the organic layer partaking in the construction of the organic EL element is formed of a generally extremely unstable organic material, it produces a defect of being readily deteriorated by the influence of oxygen and moisture and entails the problem that the element suffers from shortness of the service life. The organic EL element, therefore, necessitates a countermeasure against the invasion of the interior of the element by oxygen and moisture existing in the ambience of the organic EL element.

The organic EL element generates not only light but also heat. When this heat accumulates inside the element, it induces deterioration of the organic material. Thus, the ability of the element to radiate heat constitutes an important matter. This problem of the generation of heat by the organic EL element tends to become more conspicuous in consequence of the enlarging the surface area of the light-emitting area as in the organic EL element for use in illumination, for example.

As the measure against the invasion by oxygen and moisture, the ordinary organic EL element, for example, adopts a configuration that has the element part containing the organic layer sealed with a sealing can made of metal or glass and has the gap inside the sealing can filled with an inert gas such as nitrogen gas Since the organic EL element so configured as to effect necessary sealing with a sealing can is required to have the relevant components individually sealed with a sealing can, it entails numerous problems in terms of workability, productivity, and cost of production as well. Further, owing to the configuration requiring the periphery of the element part containing the organic layer to be sealed with a sealing can, the element entails the problem of rendering necessary cooling difficult. An attempt to attach a structural body with high thermal conductivity contiguously to the element part containing the organic layer with a view to enhancing the effect of thermal radiation, for example, is not easily implemented in the organic EL element possessing such a small thickness as several hundred nm and revealing poor mechanical strength. To do justice by all means, the effect of thermal radiation is very low because the inert gas with low thermal conductivity intervenes between the stacked body containing the organic layer and the sealing can, although the sealing can additionally fulfills the function of radiating the heat generated in the stacked body.

As structures for sealing an organic EL element without using a sealing can, the configurations that accomplish the sealing of a stacked body containing an organic layer by covering the stacked body with a protective film made of a resinous material have been proposed (refer to U.S. Pat. No. 3,334,408 and U.S. Pat. No. 3,405,335, for example). The invention described in U.S. Pat. No. 3,334,408 discloses a configuration that enables prevention of the invasion by oxygen and moisture with a multilayer structure consisting of a protective layer, a sealing layer, an internal air isolation layer, etc and the invention described in U.S. Pat. No. 3,405,335 discloses a configuration that attains the formation of a protective layer against mechanical damage by further superposing on a multilayer film a protective layer such as a plastic sheet or a metallic sheet.

Then, as heat-radiating structures for an organic EL element, the configurations that accomplish the thermal radiation by sealing an element part containing an organic layer with a protective film and attaching a radiator plate directly to the protective film have been proposed (refer to JP-A HEI 10-106746 and JP-A HEI 10-2756681, for example). The inventions described in JP-A HEI 10-107646 and JP-A HEI 10-275681 disclose a configuration that accomplish the thermal radiation by causing a radiator plate (plate of glass, resin, ceramic, or metal) to be tightly joined directly on a water-repellent protective film, for example.

However, the inventions disclosed in U.S. Pat. No. 3,334,408 and U.S. Pat. No. 3,405,335 mentioned above have a principal purpose in perfecting a film-sealing structure and pay virtually no consideration to thermal radiation. U.S. Pat. No. 3,405,335, for example, discloses a concept of superposing a plastic sheet or a metallic sheet on a film-sealing structure and does not assume at all the function of a radiator plate. Let alone, the optimization of a structure for effecting thermal radiation of high efficiency and a structure for reconciling film sealing and thermal radiation is not assumed at all.

The inventions described in JP-A HEI 10-106746 and JP-A HEI 10-275681 mentioned above, while disclosing a concept of providing a radiator plate, pay virtually no consideration to film sealing and merely go the length of making a simple statement that a radiator plate is provided. Naturally, the inventions disclosed in JP-A HEI 10-106746 and JP-A HEI 10-275681 have absolutely no mention of the optimization of a structure for reconciling film sealing and thermal radiation.

In the case of directly disposing a radiator sheet on a sealing film, the radiator sheet is ordinarily pasted to the sealing film by the use of an adhesive agent, for example. It has been unveiled that the environment prevailing in this case during the curing of the adhesive agent exerts an adverse effect on the organic EL element. When a photo-curing adhesive agent is used, for example, since the ultraviolet light radiated for the purpose of curing this adhesive agent irradiates the organic EL element at the same time, it causes deterioration of the organic substance in the organic EL element. When a thermosetting adhesive agent is used, since the curing thereof necessitates application of heat, the outgassing occurring during the heating infiltrates the sealing film and reaches the organic EL element part and likewise causes deterioration of the organic EL element part. The conventional technique has not recognized at all the adverse effect exerted on the organic EL element during the course of adhesion and has not taken any measure against the adverse effect.

DISCLOSURE OF THE INVENTION

Means for Solving the Problem

This invention which has been proposed in view of such true state of affairs as prevailing to date is aimed at accomplishing such optimization of a configuration as enables reconciliation of sealing and thermal radiation and is also aimed at providing an organic semiconductor element that is capable of infallibly intercepting oxygen and moisture and allowing thermal radiation with high efficiency. This invention is further aimed at providing an organic semiconductor element that is capable of suppressing the adverse effect occurring during the adhesion of a radiator plate and restraining the deterioration of the organic semiconductor element part (organic EL element).

With a view to solving the problem mentioned above, the organic semiconductor element contemplated by this invention is characterized by covering an organic semiconductor element part formed on a substrate with a planarizing layer, fixing a radiator plate on the planarizing layer as well with an adhesive layer, and forming between the adhesive layer mentioned above and the planarizing layer mentioned above a shield layer for preventing the organic semiconductor element part from the adverse effect induced during the curing of the adhesive layer.

The organic semiconductor element described above adopts a film-sealing structure that is adapted to seal the organic semiconductor element part with such thin films as the planarizing layer and the shield layer and is enabled to prevent moisture and oxygen from invading the interior of the element by causing the radiator plate to adhere to the upper part of the film-sealing structure.

Further, in the organic semiconductor element, since the planarizing layer and the shield layer are formed as sealing films on the organic semiconductor element part and the radiator plate is fixed on the sealing films via an adhesive layer as well, the heat generated in the organic semiconductor element part is promptly conducted to the radiator plate via the sealing films, inducing a thermal radiation of high efficiency.

The configuration resulting from simple adhesion of the radiator plate to the conventional film-sealing structure has a possibility that the organic EL element part will be exposed to the adverse effect caused during the adhesion of the radiator plate. In the organic semiconductor element of this invention, therefore, the structure of the sealing films covering the organic semiconductor element part is optimized. To be specific, the sealing films are formed in a laminated structure that is separated in function into the planarizing layer serving to cover the organic semiconductor element part and the shield layer serving to cover the planarizing layer and the shield layer is selected as a layer capable of manifesting the function of intercepting the adverse effect generated during the adhesion of the radiator plate. By disposing the shield layer of this nature between the organic semiconductor element part and the adhesive layer, it is made possible to utilize the shield layer for intercepting the light used during the curing of the adhesive layer and the outgassing occurring during the curing of the adhesive layer with the shield layer and prevent the light from irradiating the organic EL element part and the release gas from reaching it. As a result, the adhesion of the radiator plate is accomplished without exerting any adverse effect on the organic EL element.

When the aforementioned adhesive layer is a photo-curing adhesive layer, for example, the shield layer mentioned above intercepts the light to be used for curing the photo-curing adhesive layer. Since the interception by the shield layer of the light (mainly the ultraviolet light) during the curing of the adhesive layer results in preventing the light during the curing of the adhesive layer from reaching the organic semiconductor layer below the shield layer, the deterioration of the organic semiconductor layer by the light can be infallibly suppressed.

Further, when the adhesive layer mentioned above is a thermosetting adhesive layer, the shield mentioned above intercepts the outgassing occurring during the curing of this thermosetting adhesive layer. The interception by the shield layer of the gas generated during the curing of the thermosetting adhesive layer results in infallibly suppressing the deterioration of the organic semiconductor layer below the shield layer by the gas.

Incidentally, as a result of the study pursued by the present inventors, it has been found that the adverse effect induced during the adhesion of the radiator plate cannot be completely intercepted when the shield layer is formed directly on the organic semiconductor element part. In the organic semiconductor element of this invention, therefore, the planarizing layer is disposed between the organic semiconductor element part and the shield layer. By covering the surface of the organic semiconductor element part with the shield layer thereby smoothing the irregularities on the surface of the organic semiconductor element part and subsequently disposing the shield layer on the planed surface, it is made possible to give the formed shield layer a good film quality revealing very few faults and consequently enable the shield layer to intercept infallibly the adverse effect taking place during the adhesion of the radiator plate.

Effect of the Invention

This invention, by sealing the organic semiconductor element part with the thin films and depositing the radiator plate on the sealing films, is enabled to intercept the invasion of the interior of the organic semiconductor element by oxygen and moisture and realize thermal radiation of high efficiency. As a result, it is made possible to suppress the deterioration of the organic semiconductor element part caused by the abnormal thermal generation inside the organic semiconductor element part and the invasion thereof by oxygen and moisture and give rise to the organic semiconductor element materializing further elongation of the service life.

Further, the organic semiconductor element of this invention, by disposing the planarizing layer and the shield layer as sealing films on the organic semiconductor element part, is enabled to intercept the adverse effect during the fixing of the radiator plate with the shield layer and prevent this adverse effect from being exerted on the organic semiconductor element part and restrain infallibly the deterioration of the organic semiconductor element during the fixing of the radiator plate.

BRIEF DESCRIPTION OF THE DRAWINGS

FIG. 9 is a photograph showing difference in barrier property between an organic EL element using a UV-curing adhesive agent and an organic EL element using a sheet of thermosetting adhesive agent.

BEST MODE OF EMBODYING THE INVENTION

Figure 1:
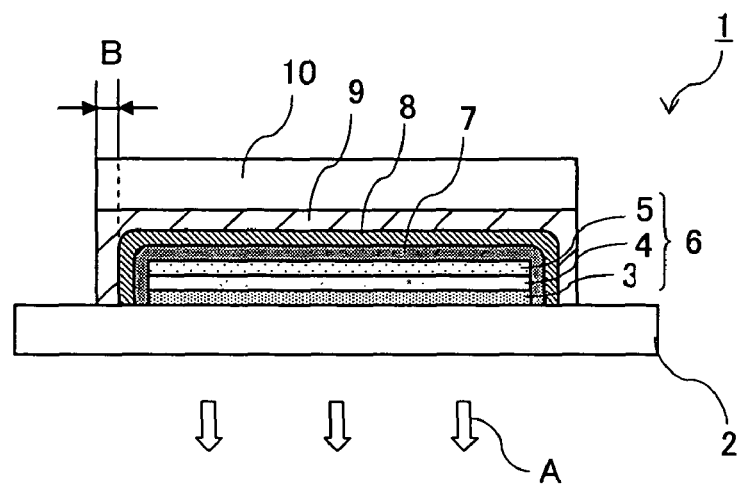
FIG. 1 is a schematic cross section illustrating one example of the organic EL element embodying this invention.

Now, the organic semiconductor element embodying the present invention will be described specifically below by reference to the accompanying drawings. Though the organic semiconductor element will be explained below by citing an organic electroluminescence (hereinafter referred to simply as "organic EL") element as an example, it goes without saying that this invention does not need to be limited thereto but is applicable to all the organic semiconductor elements that necessitate measures for sealing and thermal radiation FIG. 1 is a cross section of an organic EL element 1. The organic EL element 1 is provided with an element part 6 resulting from stacking an anode 3, an organic layer 4 formed in a multilayer with one or more kinds of organic materials, and a cathode 5 sequentially in the order mentioned on a substrate 2, a planarizing layer 7 formed so as to cover the surface of the element part 6, a shield layer 8 superposed on the planarizing layer 7, an adhesive layer 9 disposed on the shield layer 8, and a radiator plate 10 adhered to the surface of the adhesive layer 9. This organic EL element 1 is so adapted that the light emitted from the light-emitting layer in the organic layer 4 may be extracted through the back surface of the substrate 2 of the organic EL element 1 as shown by the arrow mark A.

Though the substrate 2 is not particularly limited, substrates of glass, plastics, etc. that possess a light transmission property are usable.

The element part 6 formed on the substrate 2 results from stacking the anode 3, the organic layer 4, and the cathode 5 sequentially in the order mentioned. Here, the anode 3 is formed when such an electrically conductive material as ITO (indium tin oxide) or indium zinc oxide that possesses a light transmission property is caused to form a film by sputtering, for example.

The organic layer 4 superposed on the anode 3 results from stacking a hole injection layer, a light-emitting layer, an electron injection layer, etc. sequentially in the order mentioned as reckoned from the anode 3 side, for example. Then, the organic layer 4 may be in a structure having a hole transfer layer interposed between the light-emitting layer and the hole injection layer, a structure having an electron transfer layer interposed between the light-emitting layer and the electron injection layer, or a structure of a single layer. The organic layer 4 is not limited to the structures mentioned above but is allowed to assume a varying structure.

The cathode 5 disposed on the organic layer 4 results from causing a metal or an alloy of aluminum, for example, to form a film by sputtering or vapor deposition.

The organic EL element 1 of this invention causes the anode 3, the organic layer 4, and the cathode 5 to be formed severally in a uniform thickness throughout the entire area and gives the region containing the anode 3, the organic layer 4, and the cathode 5 in a laminated state a surface area (light-emitting area) of not less than 100 mm$^2$ (the square of 10 mm, for example), for example. The organic EL element of such a large surface area as this renders such problems as addition to the amount of heat generated and deterioration of the organic EL layer due to accumulation of heat conspicuous as compared with the organic EL element of a small surface area and consequently enables the measure for emitting thermal radiation by the formation of a sealing structure with a thin film and the attachment of the radiator plate 10 to prove extremely effective.

The planarizing layer 7 covering the element part 6, with a view to improving the film quality of the shield layer 8 formed thereon and exalting the barrier property of the shield layer 8, is required to possess smoothness for uniformly covering differences in grade, irregularities, and pinholes in the surface of the element part 6. Besides, the planarizing layer 7 prefers to possess a gas barrier property for protecting the element part 6 from oxygen and moisture and high thermal conductivity for promptly conducting the heat generated from the element part 6 to the radiator plate 10. From this point of view, the planarizing layer 7 is preferably formed by causing such an organic insulating material as xylylene-based high-molecular compound, polyimide-based high-molecular compound, acrylic high-molecular compound, an epoxy-based high-molecular compound, or polyurea-based high-molecular compound to be deposited in the form of a film by such a vapor phase method (dry process) as the CVD technique of plasma CVD or the PVD technique of resistance heating vapor deposition. Though the method for forming the planarizing layer by such a wet process as spread coating is conceivable, the solvent to be used for dissolving the material for forming the planarizing layer 7 and the moisture contained in the solvent possibly exert an adverse effect on the element part 6.

On the planarizing layer 7, the shield layer 8 is superposed. This invention expects the shield layer 8 to possess a function of intercepting the adverse effect exerted on the element part 6 inclusive of the organic layer 4 while the adhesive layer is being cured. When the adhesive layer 9 happens to be a photo-curing adhesive layer resulting from curing a photo-curing resin such as a UV-curing resin or a visible light-curing resin, the shield layer 8 is preferably formed so as to intercept by absorbing or reflecting the light such as the UV light or the visible light which is used for curing the photo-curing adhesive layer. As the material for intercepting the light used for curing the photo-curing adhesive layer, at least one member selected from the group consisting of metals such as aluminum, gold, and silver, metal oxides such as zinc oxide, titanium oxide, and cesium oxide, metal sulfates such as barium sulfate, and barium titanate, barium titanozirconate, and strontium titanate may be used. Among other materials enumerated above, such metals as aluminum, gold, and silver are used particularly advantageously because they excel in the barrier property. Owing to the fact that the shield layer 8 intercepts the light such as the UV light to be used for curing the photo-curing adhesive layer, it is made possible to protect the element part 6 from the light used for photo-curing the adhesive layer 9 and restrain the deterioration of the organic layer 4 while the radiator plate 10 is being fixed.

When the adhesive layer 9 happens to be a thermosetting adhesive layer resulting from curing a thermosetting resin, the shield layer 8 is preferably formed so as to intercept the outgassing occurring from the thermosetting resin during the curing of the thermosetting adhesive layer. As the material possessing the gas barrier property capable of intercepting the gas generated from the thermosetting resin, the material for intercepting the light used during the curing of the photo-curing adhesive layer mentioned above or at least one member selected from the group consisting of metal fluorides such as magnesium fluoride, calcium fluoride, and lithium fluoride, metal nitrides such as aluminum nitride, silicon oxides such as silicon dioxide, and silicon nitrides such as silicon nitride may be used. Among other materials enumerated above, metals such as aluminum, gold, and silver, metal nitrides such as aluminum nitride, silicon oxides such as silicon dioxide, and silicon nitrides such as silicon nitride are used particularly advantageously because they excel in barrier property and manifest a high effect in blocking the removed leased gas occurring during the course of curing. Owing to the fact that the shield layer 8 intercepts the outgassing occurring during the curing of the thermosetting adhesive layer as described above, it is made possible to protect the element part 6 from the gas generated during the curing of the adhesive layer 9 and restrain the deterioration of the organic layer 4 during the fixing of the radiator plate 10.

As the structure of films of the planarizing layer 7 and the shield layer 8 mentioned above, it is fundamentally sufficient to superpose one shield layer 8 on one planarizing layer 7. This is no sole structure of the layers mentioned above. Optionally either or both of the planarizing layer 7 and the shield layer 8 may count two or more. To be specific, such structures of films as the three layers, namely a shield layer 8, a planarizing layer 7, and a shield layer 8, piled in the order mentioned and the three layers, a planarizing layer 7, a shield layer 8, and a planarizing layer 7, piled in the order mentioned may be cited as examples. Further, it is permissible to combine a planarizing layer 7 and a shield layer 8 as one set and stacking a plurality of such sets repeatedly.

Then, as for the adhesive layer 9 that is formed thereon, such resinous materials as photo-curing resins and thermosetting resin, specifically acrylic high molecular compounds and epoxy high-molecular compounds, can be used for the adhesive layer 9. Among other materials enumerated above, thermosetting adhesive agents made of thermosetting resins are usable particularly advantageously for such reasons as adding to the range of selection of the radiator plate 10 which will be described specifically below, allowing use of a plate of metal or alloy possessing high thermal conductivity, and consequently improving the shelf life (barrier property).

Particularly by using a thermosetting adhesive agent obtained in the form of a sheet (the so-called hotmelt adhesive agent), it is made possible to form the adhesive layer 9 in a uniform thickness even in an organic EL element having a large light-emitting area, for example, solve the problem of air entrapment taking place during the application of a liquid adhesive agent, and restrain the increase of the time of application attendant on the enlargement of the area of the element.

The aforementioned thermosetting adhesive agent in the form of sheet is caused by heating to exhibit fluidity and manifest adhesiveness. Since the organic EL element acquires the structure of components in consequence of multistage lamination of thin films, the adhesive agent necessitates high fluidity in order that it may acquire an excellent coating property. The aforementioned thermosetting adhesive agent in the form of sheet, therefore, is required to possess a low fluidity-starting temperature and low viscosity. On the other hand, since the organic EL element has a heat resisting temperature of about 110° C., a heat treatment at a temperature exceeding this level causes deterioration of the properties of the organic EL element. When these matters are taken into consideration, the aforementioned thermosetting adhesive agent in the form of sheet needs to acquire fluidity sufficient for coating in the environment not higher than 110° C. in temperature. In the formation of the adhesive layer 9, the curing temperature is preferably not higher than 110° C.

The adhesive layer 9 preferably has dispersed therein such fillers as a filler possessing high thermal conductivity, a filler possessing a gas adsorbing property, and a filler possessing hygroscopicity. By causing the adhesive layer 9 to contain such fillers, the organic EL element 1 is enabled to enhance further the heat radiating property and the barrier property against oxygen and moisture, depending on the kinds of filler.

Incidentally, the adhesive layer 9 mentioned above prefers to possess as small a thickness as possible in order to suppress the invasion by oxygen and moisture from the horizontal direction. It is nevertheless difficult to decrease the thickness of the adhesive layer 9 to below 20 µm. In this case, the particle diameter of the filler mentioned above is restricted by the thickness of the adhesive layer 9. The average particle diameter of the filler is preferably smaller than the thickness of the adhesive layer 9. In the case of causing the thermosetting adhesive agent in the form of sheet to include the filler, the average particle diameter prefers to be not more than one half of the thickness of the thermosetting adhesive agent (adhesive layer 9) of the form of sheet, namely not more than 10 µm.

The radiator plate 10, owing to the fact that it is fixed to the surface of the film formed in tight adhesion on the element part 6, is enabled to acquire the function of promptly radiating the heat generated from the element part 6. Further, the radiator plate 10 possesses the function as a sealing material for suppressing the infiltration of oxygen and moisture into the interior of the element and concurrently fulfills the function of reinforcing the gas barrier property of the sealing film. For the purpose of further enhancing the gas barrier property in the direction of thickness, the surface area of the radiator plate 10 prefers to be larger than the surface area of the element part 6. As the radiator plate 10, glass plates and plates of such metals and alloys as aluminum, copper, stainless steel, aluminum nitride, and tungsten copper which possess high thermal conductivity are usable. Incidentally, the radiator plate 10 may not be in the form of plate but may be in the form of sheet such as a plastic sheet possessing a gas barrier property, for example. The radiator plate 10 is not limited to the form of sheet but may assume an arbitrary form.

When the adhesive layer 9 happens to be a photo-curing adhesive layer, the radiator plate 10 is caused, subsequent to spreading a photo-curing resin on the shield layer 8, to adhere fast to the surface of the spread resin and the radiator plate 10 in the ensuant state is fixed on the adhesive layer 9 by having the surface thereof exposed to light. Since the light having permeated the radiator plate 10 implements the curing of the photo-curing adhesive layer, the radiator plate 10 prefers use of such material as, for example, a glass substrate or a plastic sheet with a gas barrier property that is endowed with permeability to the light to be used during the curing.

Then, when the adhesive layer 9 happens to be a thermosetting adhesive layer, the radiator plate 10 is caused, subsequent to spreading a thermosetting resin on the shield layer 8, to adhere to the surface of the spread resin and the radiator plate 10 in the ensuant state is fixed on the adhesive layer 9 by having the surface thereof exposed to light. When the adhesive layer 9 is a thermosetting adhesive layer, therefore, the material for the radiator plate 10 can be selected in a wider range than when the adhesive layer 9 is a photo-curing adhesive layer. Thus, for the radiator plate 10, for example, materials such as glass plate in view of light transmission property, metals and alloys of aluminum, copper, stainless steel, aluminum nitride, and copper tungsten in view of high thermal conductivity, and plastic sheet in view of light transmission property and flexibility are usable.

While the gas barrier property of the element part 6 in the direction of thickness is secured by the radiator plate 10, it is also important to heighten the gas barrier property of the element part 6 in the direction parallel to the substrate surface from the viewpoint of infallibly preventing the invasion of the interior of the organic EL element 1 by gas such as oxygen and moisture that deteriorate the element. It is, therefore, preferable that the element part 6 is positioned on the more inner side than the radiator plate 10 in a plan view and that the shorter of the two distances, i.e. one between the outer peripheral terminal part of the radiator plate 10 and the outer peripheral terminal part of the shield layer 8 in the direction parallel to the substrate surface or one between the outer peripheral terminal part of the adhesive layer 9 and the outer peripheral terminal part of the shield layer 8 in the direction parallel to the substrate surface, is not less than 1 mm. Referring to FIG. 1, the distance B between the outer peripheral terminal parts of the radiator plate 10 and the adhesive layer 9 and the outer peripheral terminal part of the shield layer 8 is preferably not less than 1 mm. Since the arrival of moisture and oxygen at the organic layer 4 becomes difficult owing to the sufficient presence of the planarizing layer 7, the shield layer 8, the adhesive layer 9, etc. in the direction parallel to the substrate surface of the element part 6 as described above, the deterioration of the element part 6 such as the organic layer 4 is suppressed more infallibly. For the purpose of more infallibly suppressing the deterioration of the element part 6, the shorter of the two distances, i.e. one between the outer peripheral terminal part of the radiator plate 10 and the outer peripheral terminal part of the shield layer 8 in the direction parallel to the substrate surface and one between the outer peripheral terminal part of the adhesive layer 9 and the outer peripheral terminal part of the shield layer 8 in the direction parallel to the substrate surface, is not less than 2 mm.

The organic EL element 1 of this nature is manufactured, for example, as will be described below. First, the element part 6 furnished with the anode 3, the organic layer 4, and the cathode 5 is formed in accordance with the ordinary method on the substrate 2. Subsequently, an organic insulating material is deposited in the form of a film by the vapor phase method, for example, to cover the surface of the element part 6 and form the planarizing layer 7. Then, the shield layer 8 is deposited so as to cover the planarizing layer 7. A resinous material destined to form the adhesive layer 9 is spread so as to cover the shield layer 8 and the radiator plate 10 is adhered fast on the resinous material forming the adhesive layer 9. The resultant spread of resinous material is cured by a proper method and converted into the adhesive layer 9 and the radiator plate 10 is fixed on the adhesive layer 9. As a result, the organic EL element 1 shown in FIG. 1 is obtained.

The organic EL element 1 is enabled, by causing the light-emitting surface of the element part 6 to have such a large surface area as not less than 100 mm, to be utilized as a lighting unit for decorative illumination, for example. The organic EL element 1 is also enabled, by having a plurality of element parts 6 disposed between the substrate 2 and the radiator plate 10, to form an organic EL display.

Since the organic EL element 1 of this invention has the element part 6 sealed with the thin films of planarizing layer 7 and shield layer 8 and has the radiator plate 10 adapted to be attached to the sealing films as described above, the invasion of the interior of the element by oxygen and moisture can be infallibly intercepted and the deterioration of the element part 6 can be suppressed. Further, owing to the fact that the sealing films of planarizing layer 7 and shield layer 8 are formed on the element part 6 and the radiator plate 10 is attached thereto, the thermal radiation can be efficiently enabled in the absence of such an inert gas as possesses low thermal conductivity.

Further, owing to the fact that the organic EL element 1 has the radiator plate 10 attached thereto with the object of reconciling the gas barrier property capable of intercepting oxygen and moisture and the heat radiating property and has the shield layer 8 disposed therein for the purpose of intercepting the adverse effect taking place during the adhesion of the radiator plate 10, the organic EL element 1 is enabled to secure the heat radiating property and the gas barrier property against moisture and oxygen and as well suppress the deterioration of the element part 6 such as the organic layer taking place during the adhesion of the radiator plate 10. By disposing the planarizing layer 7 below the shield layer 8, it is made possible to enhance the film quality of the shield layer 8 and enable the effect possessed by the shield layer 8 to be manifested to the maximum. In the organic EL element 1 of such a configuration that the element part 6 is sealed with films and the radiator plate 10 is attached thereto as described above, by optimizing the composition of each of the component layers fulfilling isolated functions, it is made possible to reconcile the film sealing property and the heat radiating property, protect the element part 6 from the adverse effect taking place while the radiator plate 10 is fixed, and suppress the deterioration of the element part 6 including the organic layer 4.

In the case of sealing the organic EL element with a sealing can, since the thickness of the sealing can is required to be increased in consequence of enlargement of the organic EL element from the viewpoint of insuring strength, the thickness of the organic EL element itself is inevitably increased. By contrast, the organic EL element 1 of this invention can be expected to bring about an effect of decreasing the thickness of itself because it is sealed by fast adhesion of a plurality of films and the radiator plate 10 to the element part 6. Further, since the planarizing layer 7 and the shield layer 8 can be formed by the ordinary thin-film process, a multiplicity of element parts 6 can be collectively sealed and the process for the adhesion of the radiator plate 10 is very simple. Thus, the production of the organic EL element 1 that excels in workability and productivity and allows a low production cost as compared with the organic EL element of a structure sealed with the conventional sealing becomes feasible.

Figure 2:
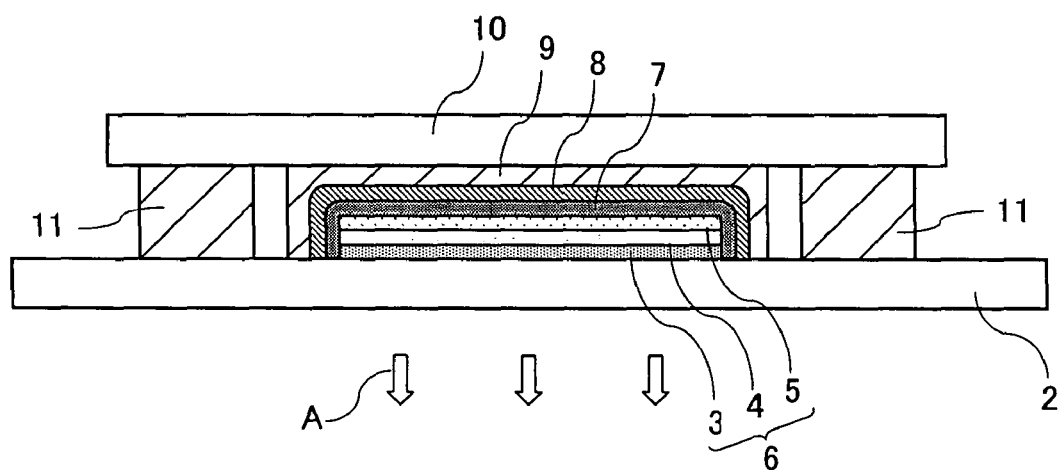
FIG. 2 is a schematic cross section illustrating another example of the organic EL element embodying this invention.

Incidentally, the organic EL element 1 of this invention does not need to be limited to the aforementioned configuration illustrated in FIG. 1 but may be in a configuration such that a spacer layer 11 for regulating the distance between the substrate 2 and the radiator plate 10 is disposed on the outer periphery of the element part 6 as shown in FIG. 2. Exertion of force on the surface of the radiator plate 10 possibly results in causing the radiator plate 10 to contact the element part 6 and consequently inflicting damage on the element part 6. By disposing the spacer layer 11 as described above, it is made possible to retain the fixed distance between the substrate 2 and the radiator plate 10 and lighten the damage on the element part 6. The spacer 11 prefers to have a height of not more than 50 μm, for example. The spacer 11 is formed of the same resin as the resin of the adhesive layer 9, for example. The spacer 11 is allowed to contain minute globular glass spacers therein.

The spacer layer 11 is formed as follows, for example. First, a resinous material destined to form the adhesive layer 9 is spread so as to cover the shield layer 8, then a resinous material destined to form the spacer layer 11 is spread linearly on the substrate 2 so as to enclose the outer periphery of the spread of the first resinous material, the radiator plate 10 is caused to adhere fast on the resinous material destined to form the adhesive layer 9 and the resinous material destined to form the spacer 11, and the resultant superposed spreads of resinous materials are cured by a proper method to give rise to the adhesive layer 9 and the spacer 11.

Now, the concrete examples of the organic EL element embodying this invention will be explained below by reference to the results of experiments.

Experiment 1

In this experiment, the influence of a shield layer on an organic EL element using a UV-curing resin for an adhesive layer was studied. First, CuPc (200 Å in thickness), α-NPD (200 Å in thickness), Alq (500 Å in thickness), LiF (10 Å in thickness), and Al (2000 Å in thickness) were vacuum deposited sequentially in the order mentioned by the resistance heating method on a cleaned ITO-applied glass substrate (0.7 mm in thickness) to form an organic layer and a cathode. Subsequently, polymonochloroparaxylylene (2 μm in thickness) was deposited as a planarizing layer by the hot CVD method and Al (6000 Å in thickness) was vacuum deposited as a shield layer by the resistance heating method. Then, a UV-curing epoxy resin was spread, a glass sheet (0.7 mm in thickness) was mounted as a radiator plate on the spread resin, and the resin was cured to produce the organic EL element. Incidentally, the UV-curing epoxy resin was cured with a metal halide lamp by radiating the UV light of a wavelength of 365 nm contained in the lamp and adjusted at 6000 mJ/cm$^2$. The after cure was performed at a temperature of 80° C. for one hour. The device size (light-emitting area) was set at 1 mm in height×1.5 mm in length. An organic EL element intended for a comparative example was manufactured by following the procedure of this experiment while SiOx(6000 Å in thickness) was deposited as a shield layer by the sputtering method.

Figure 3:
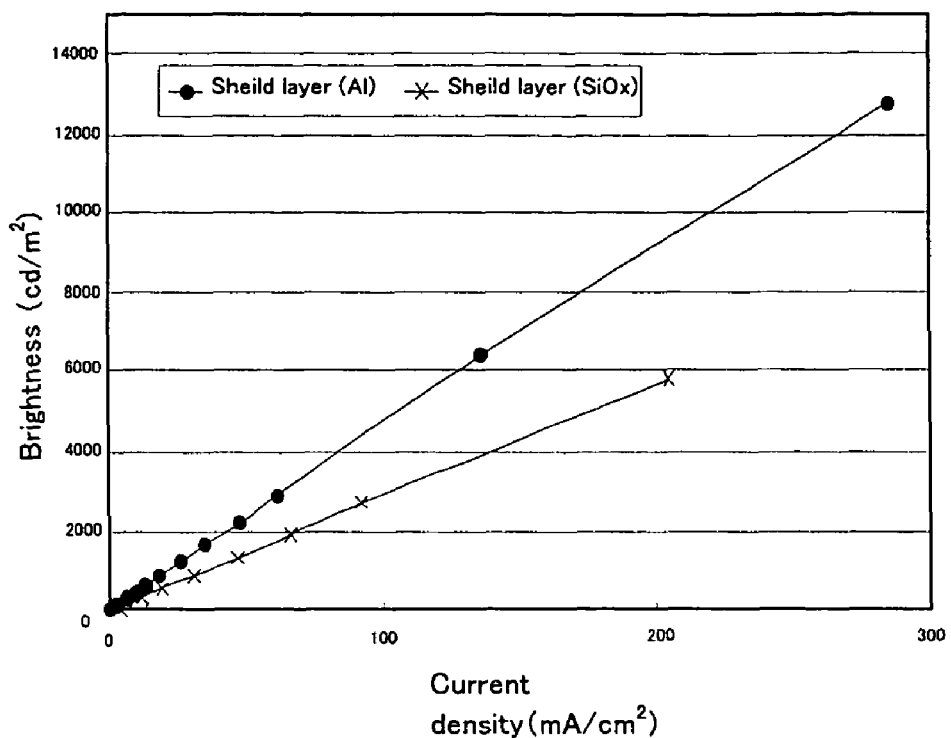
FIG. 3 is a characteristic diagram showing the current density-luminance property of an organic EL element using a UV-curing epoxy resin for an adhesive layer.

The organic EL elements manufactured as described above were each tested for current density—brightness property. The results are shown in FIG. 3. It is confirmed from FIG. 3 that the sample using Al for the shield layer acquired high brightness at a low current density, while the sample using SiOx for the shield layer suffered deterioration of the organic material of the element part because of the failure to intercept the UV light from the metal halide lamp and revealed impaired brightness property as compared with the sample of Example 1.

Experiment 2

In this experiment, the effect of a shield layer manifested when a thermosetting acrylic resin was used for an adhesive layer was studied. First, CuPc (200 Å in thickness), α-NPD (200 Å in thickness), Alq (500 Å in thickness), LiF (10 Å in thickness), and Al (2000 Å in thickness) were vacuum deposited sequentially in the order mentioned by the resistance heating method on a cleaned ITO-applied glass substrate (0.7 mm in thickness) to form an organic layer and a cathode. Subsequently, polymonochloroparaxylylene (2 μm in thickness) was deposited as a planarizing layer by the hot CVD method and Al (3 μm in thickness) was vacuum deposited as a shield layer by the resistance heating method. Then, a thermosetting acrylic resin was spread, a glass sheet (0.7 mm in thickness) was mounted as a radiator plate on the spread resin, and the resin was cured under the conditions of 90° C. in temperature and one hour in period to produce the organic EL element. The device size (light-emitting area) was set at 1 mm in height×1.5 mm in length. In this organic EL element, the outer peripheral terminal part of the shield layer was positioned not less than 1 mm inside from the outer peripheral terminal part of the radiator plate in plan view. For a comparative example, an organic EL element having the same configuration as Example 2 while omitting the formation of a shield layer was manufactured.

Figure 4:
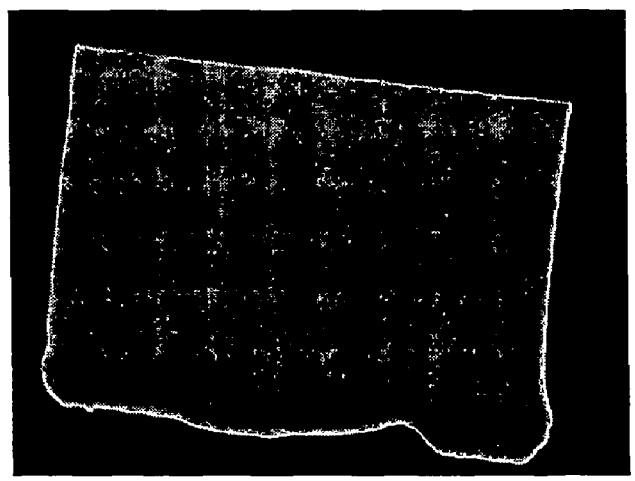
FIG. 4 is a photograph showing the state of light emission of an organic EL element using a thermosetting resin for an adhesive layer and forming a shield layer (Al).
Figure 5:
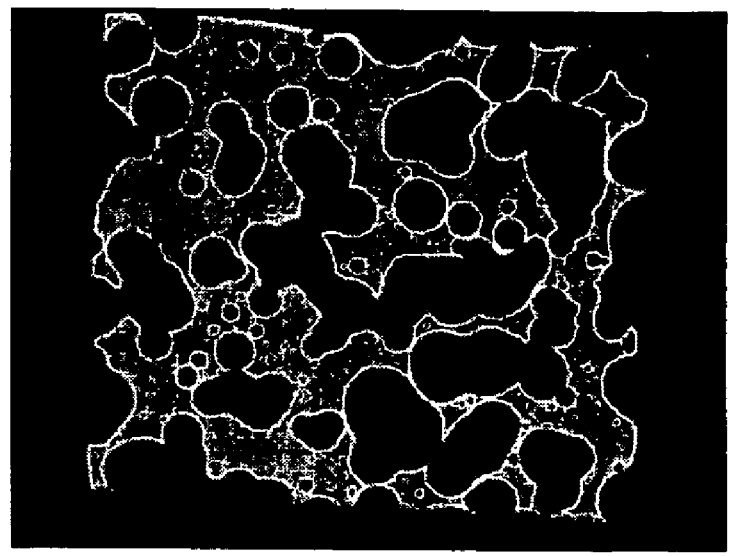
FIG. 5 is a photograph showing the state of light emission of an organic EL element using a thermosetting resin for an adhesive layer and forming no shield layer.

The organic EL elements manufactured as described above were exposed to flow of electric current and subjected to visual observation of the state of light emission. The photograph of the sample involving the formation of the shield layer (Al) is shown in FIG. 4 and the photograph of the sample not involving the formation of a shield layer in FIG. 5. It is clear from FIG. 4 and FIG. 5 that in the sample involving no formation of a shield layer, the element was observed to undergo deterioration and generate numerous dark spots under the influence of the outgassing occurring during the curing of the thermosetting epoxy resin.

Experiment 3

In this experiment, the positional relation between the radiator plate and the element. First, CuPc (200 Å in thickness), α-NPD (200 Å in thickness), Alq (500 Å in thickness), LiF (10 Å in thickness), and Al (2000 Å in thickness) were vacuum deposited sequentially in the order mentioned by the resistance heating method on a cleaned ITO-applied glass substrate (0.7 mm in thickness) to form an organic layer and a cathode. Subsequently, polymonochloroparaxylylene (2 μm in thickness) was deposited as a planarizing layer by the hot CVD method and Al (3000 Å in thickness) was vacuum deposited as a shield layer by the resistance heating method. Then, a UV-curing epoxy resin was spread, a glass sheet (0.7 mm in thickness) was mounted as a radiator plate on the spread resin, and the resin was cured to produce the organic EL element. Incidentally, the UV-curing epoxy resin was cured with a metal halide lamp by radiating the UV light of a wavelength of 365 nm contained in the lamp and adjusted at 6000 mJ/cm$^2$. The after cure was performed at a temperature of 80° C. for one hour. The device size (light-emitting area) was set at 1 mm in height×1.5 mm in length.

The organic EL element manufactured in this experiment was such that the outer peripheral terminal part of the radiator plate and the outer peripheral terminal part of the shield layer possessed such positional relation as to coincide in plan view. More specifically, the outer peripheral terminals of the planarizing layer and the organic layer were positioned 0.5 mm inside respectively from the outer peripheral terminals of the shield layer and the planarizing layer. That is, the positional relation of the outer peripheral terminal parts of the component layers as observed in a plan view was such that the radiator plate, the shield layer, the planarizing layer, and the organic layer parted increasingly in the order mentioned from outside.

Figure 6:
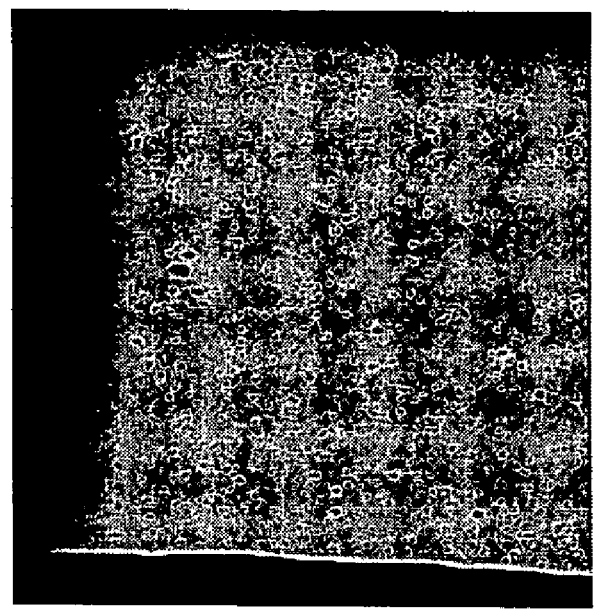
FIG. 6 is a photograph showing the initial state of light emission of an organic EL element allowing the outer peripheral terminal part of a radiator plate and the outer peripheral terminal part of a shield layer to assume such a positional relation as to establish coincide as observed in a plan view.
Figure 7:
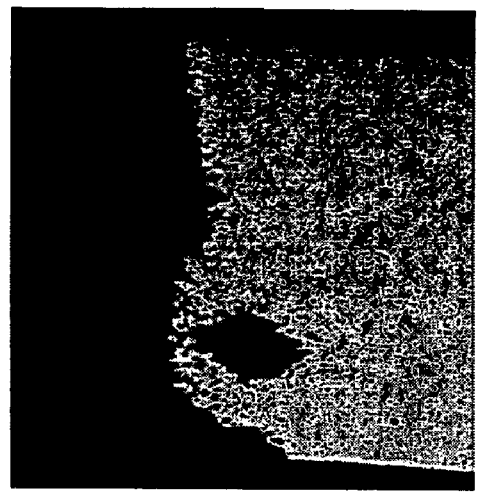
FIG. 7 is a photograph showing the state of light emission of the organic EL element shown in FIG. 6 subsequent to an acceleration test.

The organic EL element manufactured as described above was exposed to flow of electric current and subjected to visual observation of the initial state of light emission directly after manufacture (FIG. 6). Then, the organic EL element so manufactured was retained for 10 hours in a thermo-hygrostat under the conditions of 60° C. in temperature and 90% RH in relative humidity (accelerated test) and then subjected to visual observation of the state of light emission (FIG. 7)

It is clear from FIG. 6 that the region (left side) in which the outer peripheral terminal part of the cathode and the outer peripheral terminal part of the organic layer were allowed to coincide as observed in a plan view suffered the occurrence of dark spots already at a point of time preceding the accelerated test because it was deficient in barrier property as compared with the element of the optimized configuration (FIG. 4). It is also clear from FIG. 7 that corrosion by a dark area began from the region in which the outer peripheral terminal part of the cathode and the outer peripheral terminal part of the organic layer were allowed to coincide as observed in a plan view and the dark area was greatly enlarged after the accelerated test.

An organic EL element such that the outer peripheral terminal part of a shield layer was positioned not less than 1 mm inside from the outer peripheral terminal part of a radiator plate as observed in a plan view was manufactured and subjected to the same study as mentioned above. This organic EL element showed no discernible enlargement of such dark area as shown in FIG. 7 even after the accelerated test, leading to a confirmation that the state prior to the accelerated test was nearly retained (not shown).

Experiment 4

Then, the sealing with a radiator plate and the sealing with a sealing can were each studied with respect to heat radiating property. First, an organic EL element sealed with a radiator plate was manufactured. CuPc (200 Å in thickness), α-NPD (200 Å in thickness), Alq (500 Å in thickness), LiF (10 Å in thickness), and Al (2000 Å in thickness) were vacuum deposited sequentially in the order mentioned by the resistance heating method on a cleaned ITO-applied glass substrate (0.7 mm in thickness) to form an organic layer and a cathode. Subsequently, polymonochloroparaxylylene (2 μm in thickness) was deposited as a planarizing layer by the hot CVD method and Al (6000 Å in thickness) was vacuum deposited as a shield layer by the resistance heating method. Then, a UV-curing epoxy resin was spread, a glass sheet (0.7 mm in thickness) was mounted as a radiator plate on the spread resin, and the resin was cured to produce the organic EL element. Incidentally, the UV-curing epoxy resin was cured with a metal halide lamp by radiating the UV light of a wavelength of 365 nm contained in the lamp and adjusted at 6000 mJ/cm$^2$. The after cure was performed at a temperature of 80° C. for one hour. The device size (light-emitting area) was set at 20 mm in height×30 mm in length. For the purpose of measuring the rise of temperature of the radiator plate with the heat generated in the organic EL element part by means of a heat radiation thermometer, the surface of the radiator plate was coated in black with a spray.

An organic EL element sealed with a sealing can was manufactured. First, an organic layer and a cathode were formed on an ITO-applied glass substrate by following the procedure described above. Then, the element part was sealed in an atmosphere of nitrogen gas (oxygen and moisture content: not more than 10 ppm) by using a sealing can (glass cap). At this time, the gap inside the sealing cap was eventually filled with nitrogen gas. A UV-curing resin was used for adhesion of the substrate and the sealing can, cured by the radiation of a UV light with a wavelength of 365 nm at a rate adjusted to 6000 mJ/cm$^2$, and subjected to after cure implemented at 80° C. for one hour. For the purpose of measuring the rise of temperature of the sealing can with the heat generated in the organic EL element part by means of a heat radiation thermometer, the surface of the radiator plate was coated in black with a spray.

Figure 8:
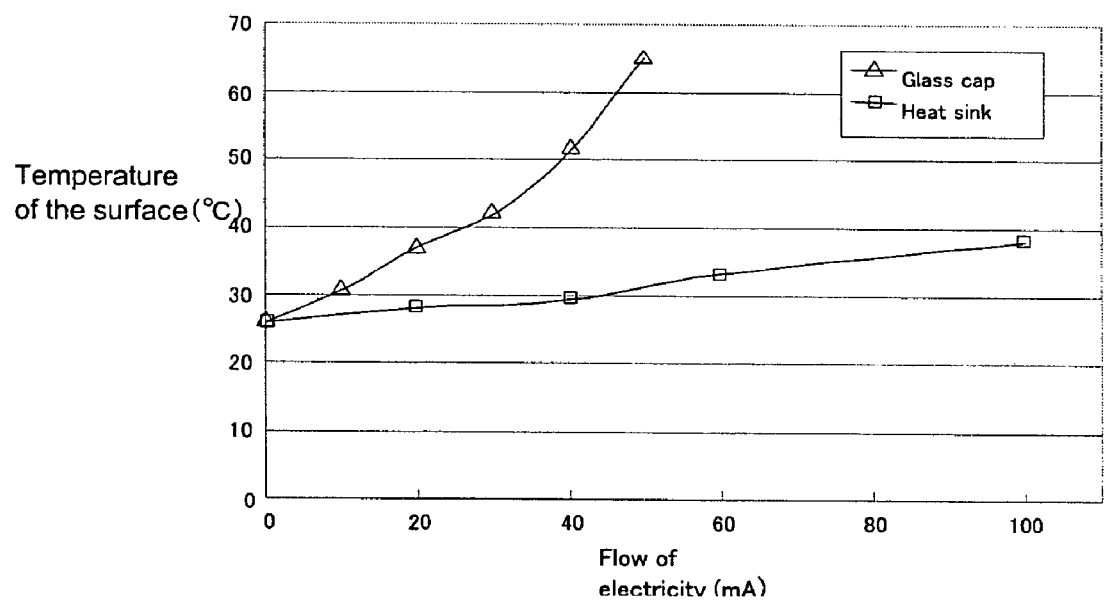
FIG. 8 is a characteristic diagram showing the current density-surface temperature property of an organic EL element using a glass cap for sealing and an organic EL element using a radiator plate for sealing.

The radiator plate or the sealing can in the organic EL element manufactured as described above was tested for rise of temperature. The measurement of temperature was initiated after the temperature had been stabilized by 5 minutes' standing subsequent to alteration of the magnitude of electric current. As shown in FIG. 8, it was found that when the radiator plate was used for sealing the organic EL element, the surface temperature of the radiator plate was not easily elevated by increasing the magnitude of electric current because the heat generated in the element part was efficiently conducted to the radiator plate and dispersed into the air. It is thought that at this time, the temperature of the element part was nearly equal to or slightly higher than the temperature of the radiator plate.

When a glass cap is used for sealing an organic EL element, the rise of temperature was more conspicuous than when a radiator plate was used. The cause of this rise of temperature is logically explained by postulating that since the heat generated in the element is transferred to the glass cap via nitrogen gas having low thermal conductivity and subsequently dispersed, the amount of heat generated in the element surpasses the amount of heat transferred to the cap and accumulates within the element (element temperature>>glass cap temperature). The rise of temperature of the element is unfavorable from the viewpoint of the service life of the element because the organic EL element is vulnerable to heat. Nevertheless, the magnitude of electric current must be increased for the purpose of endowing the element with enhanced brightness. After all, the sealing with the existing sealing can has its limit in enhancing brightness. It has been ascertained, however, that the adoption of a heat-radiating structure utilizing such a radiator plate as contemplated by this invention is effective in promoting further enhancement of brightness.

Experiment 5

In this experiment, the difference in shelf life (barrier property) when the adhesive layer 9 was formed of a UV-curing adhesive agent and when it was formed of a sheetlike thermosetting adhesive agent was studied. The organic EL elements manufactured herein were similar in structure between Test 1 (UV-curing adhesive agent) and Test 2 (thermosetting adhesive agent, in the form of sheet).

FIG. 9(*a*) shows the barrier property of an organic EL element using a UV-curing adhesive agent and FIG. 9(*b*) shows the barrier property of an organic EL element using a sheetlike thermosetting adhesive agent. The evaluation of the barrier property was implemented by comparing the initial state of light emission and the states of light emission after the elapses of 100 hours and 192 hours. As a result, the organic EL element using the sheetlike thermosetting adhesive agent showed virtually no deterioration of property even after the elapse of 192 hours, while the organic EL element using the UV-curing adhesive agent revealed deterioration of property (decrease of the region of light emission) in consequence of the elapse of time.

Figure 10:
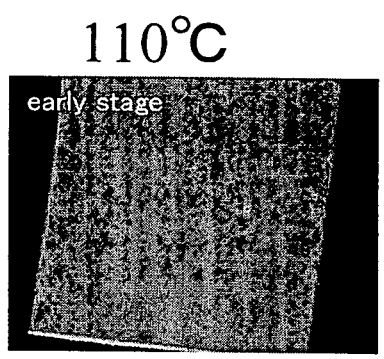
FIG. 10 is a photograph showing the appearance of characteristic changes with time taking place in samples of organic EL element subjected to heat treatments at temperatures of 110° C. and 120° C.
Figure 10:
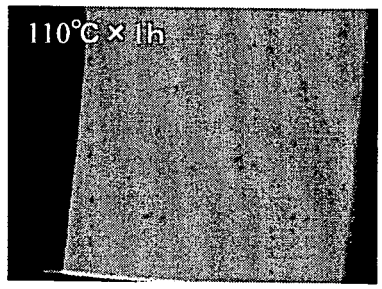
Figure 10:
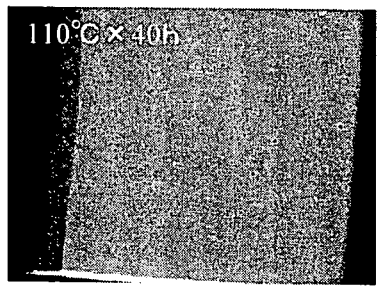
Figure 10:
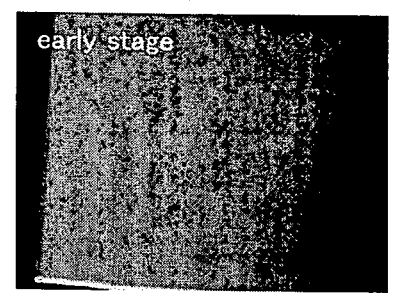
Figure 10:
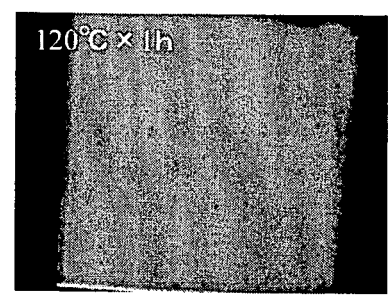
Figure 10:
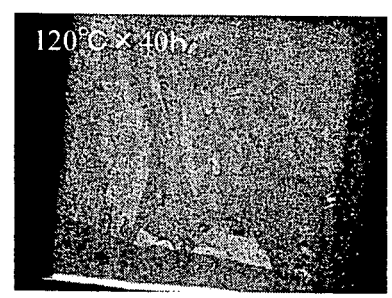

Further, in the present experiment, as a preliminary test for determining the curing temperature of the sheetlike thermosetting adhesive agent, the deterioration of property of the organic EL element by the temperature of heat treatment was studied. The results are shown in FIG. 10. FIG. 10(*a*) depicts the test in which the organic EL element was heat-treated at 110° C. and FIG. 10(*b*) depicts the test in which the organic EL element was heat-treated at 120° C. In the case of performing the heat treatment at 110° C., the deterioration of property was slight even after the heat treatment was continued for 40 hours. In contrast, in the case of performing the heat treatment at 120° C., the property was found to be deteriorated greatly after the heat treatment was continued for 40 hours. It may be concluded, therefore, that when the organic EL element is manufactured by using the sheetlike thermosetting adhesive agent mentioned above, preferably the curing temperature of this adhesive agent is set at a level not higher than 110° C.

The invention claimed is:

1. An organic semiconductor element, comprising:
   a substrate,
   an organic semiconductor element part formed on the substrate,
   a planarizing layer covering the organic semiconductor element part,
   a pre-prepared radiator plate adhered on the planarizing layer,
   a thermosetting adhesive layer disposed between the radiator plate and the planarizing layer for adhering the radiator plate on the planarizing layer,
   a shield layer formed between the adhesive layer and the planarizing layer, said shielding layer shielding gas when the thermosetting adhesive layer is cured, and
   a spacer layer disposed about an outer peripheral terminal part of the organic semiconductor element part to directly interconnect the substrate and the radiator plate and regulate an interval between the substrate and the radiator plate,
   wherein the planarizing layer contains xylylene-type high molecular compounds as an organic insulating material, and
   wherein the shield layer comprises a light shielding layer which intercepts light tending to impinge on the organic semiconductor element.

2. An organic semiconductor element according to claim 1, wherein the shield layer comprises at least one member selected from the group consisting of aluminum, gold, and silver, and a metal oxide including zinc oxide, titanium oxide, and cesium oxide, metal sulfates including barium sulfate, and barium titanate, barium titanozirconate, and strontium titanate.

* * * * *